United States Patent
Furuta et al.

(10) Patent No.: US 9,040,839 B2
(45) Date of Patent: May 26, 2015

(54) WIRING BODY CONNECTION STRUCTURE

(75) Inventors: Norihiko Furuta, Komaki (JP); Motoyuki Furuta, legal representative, Gifu (JP); Lei Zhu, Komaki (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 74 days.

(21) Appl. No.: 13/097,798

(22) Filed: Apr. 29, 2011

(65) Prior Publication Data

US 2012/0026700 A1    Feb. 2, 2012

(30) Foreign Application Priority Data

Jul. 29, 2010   (JP) ................................. 2010-170226

(51) Int. Cl.
*H05K 1/00* (2006.01)
*H05K 3/36* (2006.01)
*H05K 3/32* (2006.01)

(52) U.S. Cl.
CPC ................ *H05K 3/361* (2013.01); *H05K 3/323* (2013.01); *H05K 2201/0133* (2013.01); *H05K 2201/0162* (2013.01)

(58) Field of Classification Search
CPC ....... H05K 3/321; H05K 3/323; H05K 3/361; H05K 3/365; H05K 3/368; H05K 2201/0133; H05K 2201/0162; H05K 2201/10977
USPC ................................. 439/68; 174/259, 117 FF
See application file for complete search history.

(56) References Cited

U.S. PATENT DOCUMENTS

| 5,799,392 | A * | 9/1998 | Mishiro | 29/830 |
| 7,026,382 | B2 * | 4/2006 | Akiba et al. | 524/268 |
| 2008/0099230 | A1 * | 5/2008 | Takahashi et al. | 174/250 |
| 2009/0067147 | A1 * | 3/2009 | Suzuki | 361/790 |
| 2010/0033196 | A1 | 2/2010 | Hayakawa et al. | |

FOREIGN PATENT DOCUMENTS

| JP | 61-274392 | 12/1986 |
| JP | 05-025446 | 2/1993 |
| JP | 05-218634 | 8/1993 |
| JP | 2007-173226 | 7/2007 |
| JP | 2010-43880 | 2/2010 |

OTHER PUBLICATIONS

Japan Office action, mail date is Jan. 21, 2014 and partial English language translation thereof.

* cited by examiner

*Primary Examiner* — Anatoly Vortman
*Assistant Examiner* — Jacob Crum
(74) *Attorney, Agent, or Firm* — Greenblum & Bernstein, P.L.C.

(57) ABSTRACT

A wiring body connection structure includes a first wiring body and a second wiring body, the first wiring body having a first base material made of an elastomer and a first wiring containing an elastomer and a conductive material, the second wiring body having a second base material and a second wiring. In the wiring body connection structure, a laminated section is partitioned where a first end of the first wiring body and a second end of the second wiring body overlap in a front-rear direction. The wiring body connection structure further includes a cover member arranged on a front surface of the first wiring body, and a conductive adhesive layer bonding the first end and the second end in the laminated section while ensuring a conductive property. The cover member is interposed between a frontmost end of the second end and the first wiring in the laminated section.

9 Claims, 4 Drawing Sheets

Fig. 1
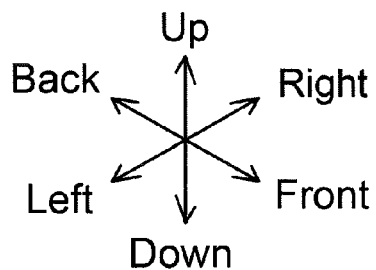
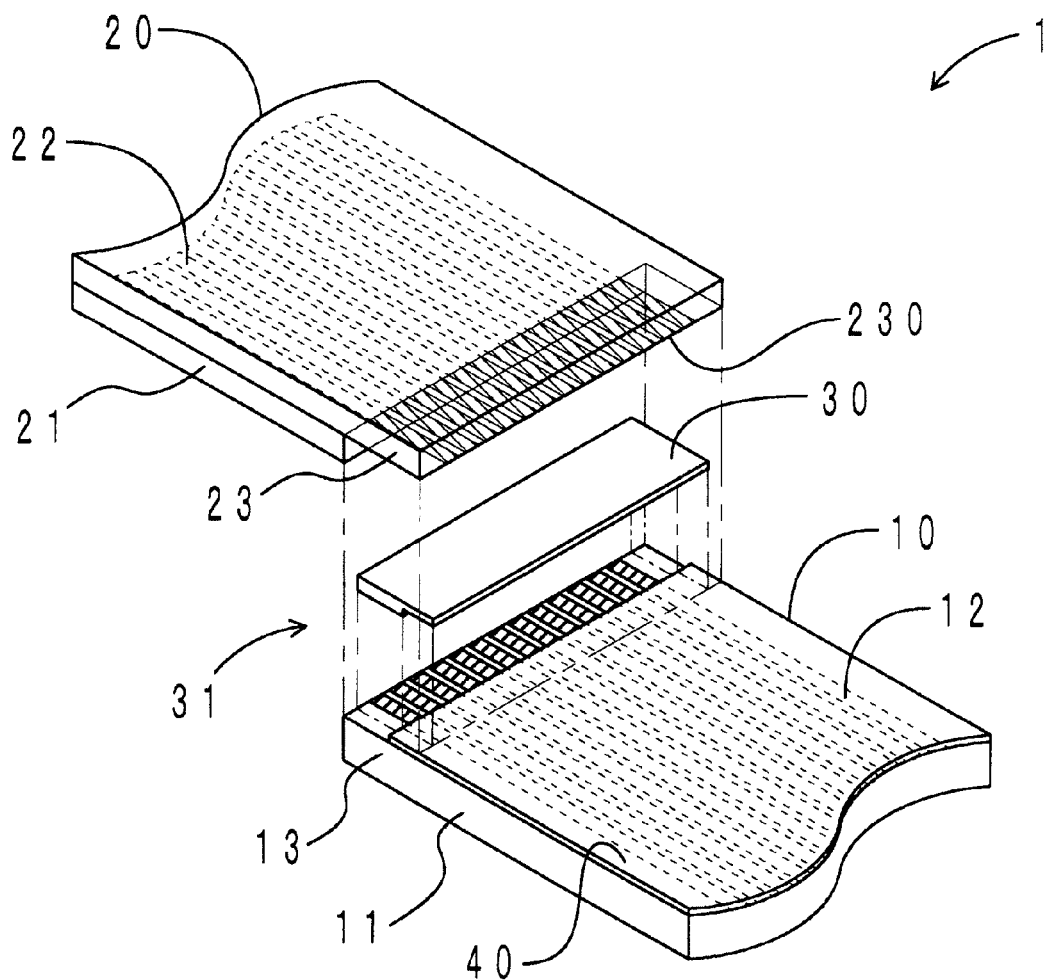

PRIOR ART

WIRING BODY CONNECTION STRUCTURE

CROSS-REFERENCE TO RELATED APPLICATIONS

The present application claims priority under 35 U.S.C. §119 of Japanese Application No. 2010-170226, filed on Jul. 29, 2010, the disclosure of which is expressly incorporated by reference herein in its entirety.

BACKGROUND OF THE INVENTION

1. Field of the Invention

The present invention relates to a wiring body connection structure electrically connecting a flexible extendable and contractible wiring body that utilizes an elastomer and another wiring body connectable to a connector on a circuit board.

2. Description of Related Art

Flexible sensors, actuators and the like have been developed utilizing elastomer. For flexible sensors and actuators, it is required that an electrode and a wiring are able to follow deformation of a base material, a dielectric film and the like that are made from an elastomer. For example, a capacitive sensor can be formed by arranging a pair of electrodes on front and rear surfaces of a dielectric film made from an elastomer. In this case, when a load is applied to the sensor, the dielectric film deforms. In this case, it is desirable that the electrodes are extendable and contractible in accordance with the deformation of the dielectric film so as not to impede the deformation of the dielectric film. Similarly, it is desirable that wirings connected to the electrodes are extendable and contractible following the deformation of the dielectric film and the electrodes. Therefore, attempts have been made to form electrodes and wirings from a conductive material that combines powders of a conductive carbon or a metal with an elastomer (for example, see Related Arts 1 and 2).

In the above described flexible sensor and the like, one end of a wiring is connected to an electrode and the other end is connected to an electrical circuit of a control device or the like. However, a method allowing a stable connection between an extending and contracting flexible wiring and an electrical circuit has not yet been established. On the other hand, as a method of making an electrical connection between terminals of an existing circuit board such as a flexible printed circuit board (FPC), an anisotropic conductive adhesive and the like have been used (for example, see Related Arts 3 and 4).

[Related Art 1] Japanese Patent Laid-Open Publication No. 2010-43880

[Related Art 2] Japanese Patent Laid-Open Publication No. 2007-173226

[Related Art 3] Japanese Patent Laid-Open Publication No. HEI 5-218634

[Related Art 4] Japanese Patent Laid-Open Publication No. HEI 5-25446

When a flexible wiring body is made by forming a wiring (which is made of the above described conductive material) on a front surface of a base material (which is made of an elastomer) and the flexible wiring body is connected to an electrical circuit, a possible method is to directly connect the wiring body and an existing connector provided on a circuit board. According to the existing connector, an electrode of the connector bites into a wiring body to electrically connect the wiring body and the electrical circuit. However, as described above, the wiring extends or contracts following the deformation of the connecting electrode and the dielectric film. When extension and contraction are repeated, settling occurs in the wiring due to compression set of the elastomer. In this case, in a connection by mechanical biting between the wiring body and the connector, the connection portion cannot follow the settling of the wiring. As a result, there is a risk that a contact failure may occur between the wiring body and the connector. The base material of the wiring body is made from an elastomer. The wiring also uses an elastomer as a parent material. Therefore, the wiring body has a relatively small mechanical strength. Therefore, due to biting by the connector, there is a risk that cracking may occur in the wiring and the like. As just described, when a flexible wiring body that utilizes an elastomer is connected to an existing connector, there is a problem with the reliability of the connection section. Therefore, it is difficult to directly connect a flexible wiring body to an existing connector.

A possible method is to indirectly connect a flexible wiring body to a connector of a circuit board by connecting the flexible wiring body to one end of an existing wiring body such as a flexible flat cable (FFC) or a flexible printed circuit board (FPC) and connecting the other end of the FFC or the like to the connector of the circuit board. In this method, a flexible wiring body and an FFC or the like are bonded via a conductive adhesive or the like. As an example, FIG. 4 illustrates a cross-sectional view of a connection section of a flexible wiring body and an FFC. In FIG. 4, a state of the flexible wiring body before being extended is illustrated in broken lines. As FIG. 4 illustrates, a flexible wiring body 80 includes a base material 81 made of an elastomer and a wiring 82 containing an elastomer and a conductive material. An FFC 90 includes an insulating base material 91 and a wiring 92. A back end 83 of the flexible wiring body 80 and a front end 93 of the FFC 90 are bonded via a conductive adhesive layer 30.

As described above, in the flexible wiring body 80, the wiring 82 extends and contracts together with the base material 81. On the other hand, the FFC 90 does not extend and contract. Therefore, when the flexible wiring body 80 extends, at a forefront 930 of the FFC 90, a force acts in a direction that the FFC 90 peels off (see white arrow in FIG. 4). In the wiring 82 of the flexible wiring body 80, conductive particles are filled in the elastomer. A conducting path is formed through contacts between neighboring conductive particles. However, the conductive particles are not bonded or linked to each other. Therefore, as compared to the insulating base material 91 and the wiring 92 of the FFC 90, the wiring 82 has a small mechanical strength. Therefore, when the flexible wiring body 80 repeats extension and contraction, there is a risk that the wiring 82 may break in a section abutting the forefront 930 of the FFC 90 via the conductive adhesive layer 30.

When bonding the flexible wiring body 80 and the FFC 90 via the conductive adhesive layer 30, the two wiring bodies 80 and 90 are pressurized with a conductive adhesive in a paste form therebetween. However, the wiring 82 of the wiring body 80 has a small mechanical strength. Therefore, during the pressurizing, a corner of the forefront 930 of the FFC 90 abuts the flexible wiring body 80 via the conductive adhesive, thereby making the wiring 82 easy to break.

SUMMARY OF THE INVENTION

The present invention was made in view of these realities. A purpose of the present invention is to provide a wiring body connection structure that allows realization of connection between a flexible wiring body and an electrical circuit with a high reliability and a low cost, while making a wiring difficult to break during fabrication and when used.

(1) To achieve the above described purpose, a wiring body connection structure of the present invention includes a first wiring body and a second wiring body. The first wiring body includes a first base material made of an elastomer and a first wiring arranged on the first base material and containing an elastomer and a conductive material. The second wiring body includes a second base material and a second wiring arranged on the second base material. In the wiring body connection structure, a laminated section is partitioned where a first end of the first wiring body and a second end of the second wiring body overlap in a front-rear direction. The wiring body connection structure further includes a cover member arranged on a front surface of the first wiring body and a conductive adhesive layer bonding the first end and the second end in the laminated section while ensuring a conductive property. The cover member is interposed between a forefront of the second end and the first wiring in the laminated section.

According to the wiring body connection structure of the present invention, one end (the first end) of the first wiring body and one end (the second end) of the second wiring body are connected via the conductive adhesive layer. The first wiring body includes the first base material made of an elastomer and the first wiring using an elastomer as a parent material, and is extendable and contractible. According to the wiring body connection structure of the present invention, by connecting the other end (the end different from the second end) of the second wiring body to a connector on a circuit board, the extendable and contractible first wiring body can be indirectly connected to the connector on the circuit board. As the second wiring body, for example, an existing wiring body such as an FFC or an FPC can be used. An existing wiring body such as an FFC can be connected to an existing connector such as a ZIF (Zero Insertion Force) connector. Therefore, according to the wiring body connection structure of the present invention, by taking advantage of highly reliable existing connection technologies, the flexible extendable and contractible first wiring body can be connected to a connector on a circuit board. This allows realization of connection between the first wiring body and the connector at a low cost. Therefore, the wiring body connection structure of the present invention has a high practical applicability.

The first wiring body and the second wiring body are bonded via the conductive adhesive layer. Therefore, as compared to a mechanical connection by biting, a contact failure is unlikely to occur. The conductive adhesive layer is both conductive and adhesive. Therefore, as compared to a case where other materials are used for the connection, the wiring body connection structure of the present invention can be easily downsized and thinned.

In the laminated section where the first end and the second end overlap in a front-rear direction, the cover member is interposed between the forefront of the second end and the first wiring. Therefore, even when a stress is generated in the forefront of the second wiring body (the second end) by extension and contraction of the first wiring body, the stress does not act on the first wiring, but on the cover member. That is, it is unlikely to apply a force to the first wiring in a direction that the forefront of the second end peels off. Therefore, breaking of the first wiring is inhibited. As just described, according to the wiring body connection structure of the present invention, even when the first wiring body repeats extension and contraction, the first wiring is unlikely to break. That is, the wiring body connection structure of the present invention has an excellent durability.

In fabrication of the wiring body connection structure of the present invention, when the first wiring body and the second wiring body with the conductive adhesive layer therebetween are laminated and pressurized, a corner of the forefront of the second wiring body abuts the cover member via the conductive adhesive layer. The cover member acts as a buffer, thereby reducing the stress on the first wiring. Therefore, the problem of the first wiring breaking during a fabrication process of the wiring body connection structure of the present invention can be resolved.

(2) It is preferable that in the configuration of the above described aspect (1), on the front surface of the first end, a first exposed area and a first covered area are arranged, the first exposed area being not covered by the cover member, and the first covered area being contiguous to the first exposed area and being covered from front by the cover member; on the rear surface of the second end, a second exposed area and a second covered area are arranged, the second exposed area being not covered by the cover member, and the second covered area being contiguous to the second exposed area and being covered from rear by the cover member and also containing the forefront; the first exposed area and the second exposed area are bonded via the conductive adhesive layer; and the first covered area and the second covered area are bonded via the conductive adhesive layer and the cover member.

In the laminated section, the first exposed area and the second exposed area are arranged facing each other in the front-rear direction. In the first exposed area, the first wiring is exposed. Similarly, in the second exposed area, the second wiring is exposed. Therefore, by bonding the first exposed area and the second exposed area via the conductive adhesive layer, conduction between the first wiring body and the second wiring body is ensured.

The first covered area and the second covered area are arranged facing each other in the front-rear direction. The second covered area includes the forefront of the second end. The first covered area and the second covered area are bonded via the conductive adhesive layer and the cover member. That is, from the front side toward the rear side, the second covered area (the forefront of the second end)→the conductive adhesive layer→the cover member→the first covered area are arranged. This makes it difficult for a stress occurring in the forefront of the second end to act on the first wiring of the first covered area due to a buffer effect of the cover member. Therefore, breakage of the first wiring is inhibited.

(3) It is preferable that in the configuration of the above described aspect (1) or aspect (2), the cover member has a tensile strength greater than a tensile strength of the first wiring.

According to the present configuration, even when a stress is applied from the forefront of the second end to the cover member, there is little risk that the cover member breaks. Therefore, a protective effect with respect to the first wiring is further enhanced. Therefore, according to the present configuration, breakage of the first wiring during fabrication or use can be better inhibited.

The tensile strength can be measured based on JIS K 6251 (2004). The tensile strength values in the present specification are values measured using dumbbell-shaped type No. 3 specimens.

(4) It is preferable that in the configuration of any one of the above described aspects (1)-(3), the cover member is a cover film insulating the first wiring from outside.

In the first wiring body, when the first wiring is formed on the front surface of the first base material, it is desirable that a cover film is arranged to cover the first wiring. When this is done, the first wiring can be insulated from outside. Therefore, safety is enhanced. Further, depending on the material of the cover film, it is also possible to ensure waterproofing of the first wiring and to inhibit oxidation.

For example, the cover film is interposed between the forefront of the second end and the first wiring in the laminated section. That is, in the configuration of the above described aspect (2), the cover film is arranged extending to the first covered area. When this is done, in the laminated section, from the front side toward the rear side, the second covered area (the forefront of the second end)→the conductive adhesive layer→the cover film→the first covered area are arranged. This allows the cover film to function as the above described cover member. That is, according to the present configuration, in addition to the original effects of the cover film, an effect of inhibiting breakage of the first wiring can also be achieved. According to the present configuration, it is not necessary to prepare a cover member to protect the first wiring, aside from the cover film. Therefore, the number of parts of the wiring body connection structure can be reduced, and the fabrication of the wiring body connection structure also becomes easy.

(5) It is preferable that in the configuration of any one of the above described aspects (1)-(4), the first wiring body includes a plurality of the first wirings; the second wiring body includes a plurality of the second wirings; and the conductive adhesive layer be made of an anisotropic conductive adhesive allowing the first wirings and the second wirings that are facing each other in the front-rear direction to become conductive.

The anisotropic conductive adhesive is prepared by dispersing conductive particles in an insulating resin or an insulating rubber (parent material) having an adhesive property. Examples of an anisotropic conductive adhesive include, depending on the type of the parent material, a thermoset anisotropic conductive adhesive, a thermoplastic anisotropic conductive adhesive, an ultraviolet cure anisotropic conductive adhesive, an elastomeric anisotropic conductive adhesive and the like. When an anisotropic conductive adhesive is pressurized, a conducting path is formed through point contacts between conductive particles in the parent material in a direction between connecting members. By solidification or hardening in this state, a conductive property develops. In the present specification, a reversible state change that does not involve a chemical reaction is referred to as "solidification," and an irreversible state change that involves a chemical reaction such as a cross-linking reaction is referred to as "hardening."

The anisotropic conductive adhesive has a property that it has a high conductivity in one direction (anisotropic conductivity). Therefore, when the anisotropic conductive adhesive is interposed between the first wirings and the second wirings facing each other in the front-rear direction, the wirings can be bonded to each other, and also can be made conductive between each other in a thickness direction (the front-rear direction) of the anisotropic conductive adhesive. In this case, the anisotropic conductive adhesive has a low conductivity in a planar direction of the anisotropic conductive adhesive. Therefore, there is no risk that neighboring wirings in each of the first wirings and the second wirings may be conducting between each other.

According to the wiring body connection structure of the present invention, the flexible extendable and contractible first wiring body that utilizes an elastomer can be connected to a connector on a circuit board via the second wiring body with a low cost and a high reliability. Further, according to the wiring body connection structure of the present invention, the first wirings of the first wiring body are unlikely to break during fabrication and use.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 1 is an exploded perspective view of a wiring body connection structure of an embodiment of the present invention;

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 2:
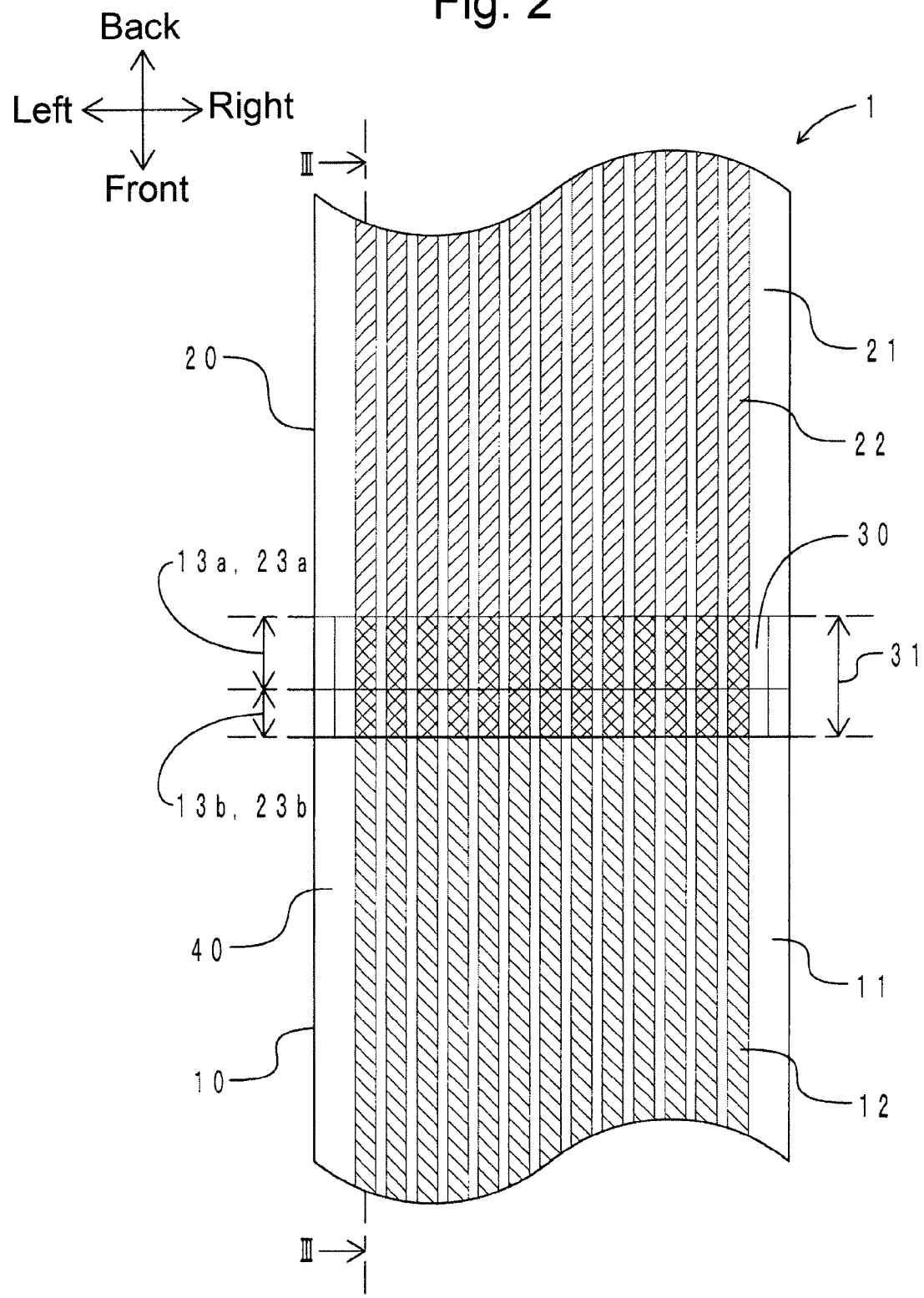
FIG. 2 is a transparent top view of the wiring body connection structure of the embodiment of the present invention.
Figure 3:
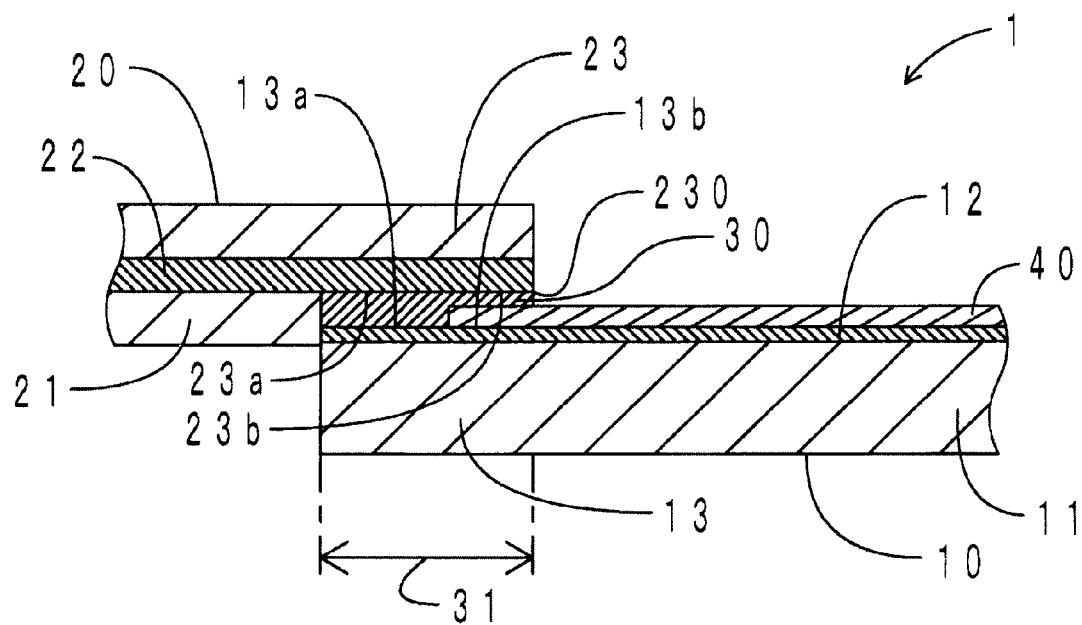
FIG. 3 is a cross-sectional view along line in FIG. 2.
Figure 4:
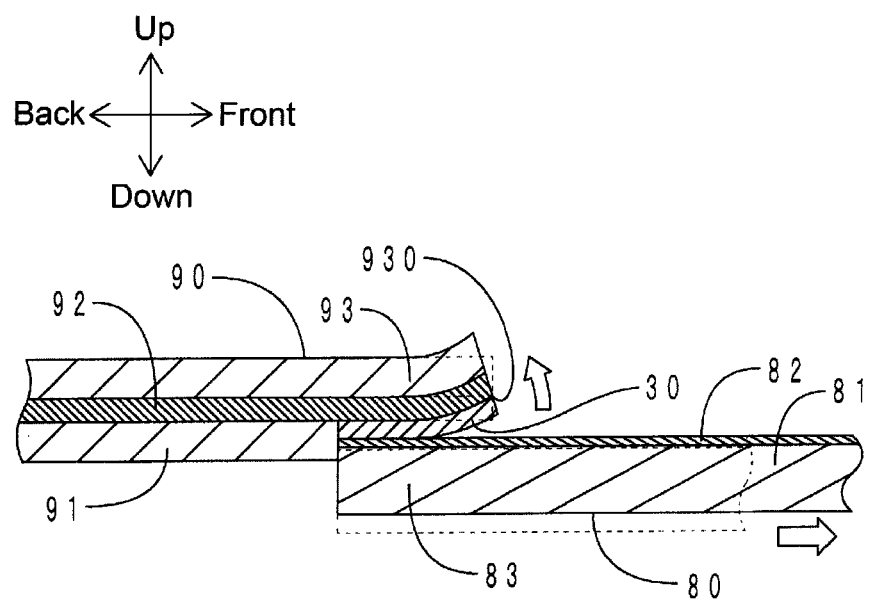
FIG. 4 is a cross-sectional view of a connection section between a flexible wiring body and an FFC.

In the following, an embodiment of a wiring body connection structure of the present invention is explained.
Configuration First, a configuration of a wiring body connection structure of the present embodiment is explained. FIG. 1 illustrates an exploded perspective view of the wiring body connection structure of the present embodiment. FIG. 2 illustrates a transparent top view of the wiring body connection structure. FIG. 3 illustrates a cross-sectional view along a line in FIG. 2. In FIG. 1, first wirings and second wirings are transparently illustrated. In FIG. 2, the first wirings and the second wirings are transparently illustrated by hatching. As illustrated in FIGS. 1-3, a wiring body connection structure 1 includes a first wiring body 10, a second wiring body 20, a conductive adhesive layer 30, and a cover film 40.

The first wiring body 10 includes an elastomer sheet 11 and first wirings 12. The elastomer sheet 11 is made of a silicone rubber, and has a belt-like shape extending in a front-back direction. The elastomer sheet 11 has a thickness of about 0.5 mm. The elastomer sheet 11 is included in a first base material of the present invention.

A total of 13 first wirings 12 are arranged on an upper surface (front surface) of the elastomer sheet 11. The first wirings 12 are each formed containing an acrylic rubber and silver powder. The first wirings 12 each have a tensile strength of 0.3 MPa. The first wirings 12 each have the form of a line. The first wirings 12 each extend in a front-back direction. The 13 first wirings 12 are arranged nearly parallel to each other at a predetermined spacing in a left-right direction.

At a back end of the first wiring body 10, a first end 13 is arranged. On an upper surface of the first end 13, a first exposed area 13a and a first covered area 13b are arranged. The first exposed area 13a is arranged at a back side on the upper surface of the first end 13. The first exposed area 13a is not covered by the cover film 40 (to be described later). That is, at the first exposed area 13a, the first wirings 12 are exposed. The first covered area 13b is arranged continuing from a front side of the first exposed area 13a. The first covered area 13b is covered from above by the cover film 40 (to be described later). That is, at the first covered area 13b, the upper surface of the elastomer sheet 11 and the first wirings 12 are covered by the cover film 40.

The second wiring body 20 is a flexible flat cable (FFC), and includes an insulating base material 21 and second wirings 22. The insulating base material 21 has a belt-like shape extending in a front-back direction. The insulating base material 21 is formed with two polyester films laminated in an up-down direction sandwiching the second wirings 22 therebetween. The polyester films each have a thickness of about 0.1 mm. The insulating base material 21 is included in a second base material of the present invention.

A total of 13 second wirings 22 are embedded inside the insulating base material 21. The second wirings 22 are tinned copper foils, and are each in a form of a line. The second wirings 22 are each extending in a front-back direction. The 13 second wirings 22 are arranged nearly parallel to each other at a predetermined spacing in a left-right direction.

At a front end of the second wiring body 20, a second end 23 is arranged. On a lower side of the second end 23, the insulating base material 21 is peeled off so as to expose the second wirings 22 on a lower surface (rear surface) of the insulating base material 21. On a lower surface of the second end 23 of the second wiring body 20, a second exposed area 23a and a second covered area 23b are arranged. The second covered area 23b is arranged at a front side on the lower surface of the second end 23. The second covered area 23b is arranged facing the first covered area 13b via the cover film 40. That is, the second covered area 23b is covered from below by the cover film 40. The second covered area 23b includes a frontmost end 230 of the second end 23. The frontmost end 230 is included in a forefront of the present invention. The second exposed area 23a is arranged continuing from a back side of the second covered area 23b. The second exposed area 23a is arranged facing the first exposed area 13a. The second exposed area 23a is not covered by the cover film 40. That is, at the second exposed area 23a, the second wirings 22 are exposed.

A back end of the second wiring body 20 is connected to a connector (not shown in the figures). The connector is provided on an electric circuit board (not shown in the figures).

In the wiring body connection structure 1, a laminated section 31 is partitioned where the first end 13 and the second end 23 are laminated in an up-down direction. In the laminated section 31, the width and spacing of the second wirings 22 are the same as the width and spacing of the first wirings 12.

The cover film 40 is made of a silicone rubber, and has a belt-like shape extending in a front-back direction. The cover film 40 has a thickness of about 20 μm. The cover film 40 has a tensile strength of 2.5 MPa. The cover film 40 is arranged on the upper surface of the first wiring body 10. The cover film 40 covers the upper surface of the first wiring body 10 from a front side to the back end of the first covered area 13b.

The conductive adhesive layer 30 is made of an anisotropic conductive adhesive in which nickel particles are dispersed in an epoxy resin. The conductive adhesive layer 30 is in a form of a sheet. The conductive adhesive layer 30 is interposed between the first end 13 and the second end 23. In this way, the first exposed area 13a and the second exposed area 23a are bonded via the conductive adhesive layer 30. The first covered area 13b and the second covered area 23b are bonded via the cover film 40 and the conductive adhesive layer 30. The first wirings 12 of the first exposed area 13a and the second wirings 22 of the second exposed area 23a become conductive via the conductive adhesive layer 30.

Fabrication Method

Next, a fabrication method of the wiring body connection structure 1 is explained. The fabrication method of the wiring body connection structure 1 includes a wiring body preparation process, an arrangement process, and an adhesion process.

In the wiring body preparation process, the first wiring body 10 and the second wiring body 20 are prepared. That is, with respect to the first wiring body 10, first, paint for wiring is screen-printed in a predetermined pattern on the upper surface of the elastomer sheet 11. By doing so, 13 first wirings 12 are formed. Next, to cover the first wirings 12 within a predetermined range, paint for cover film is screen-printed on the upper surface of the elastomer sheet 11. By doing so, the cover film 40 is formed. With respect to the second wiring body 20, a commercially available FFC can be used.

In the arrangement process, the first wiring body 10, an anisotropic conductive adhesive, and the second wiring body 20 are laminated. Specifically, first, the anisotropic conductive adhesive in a paste form before hardening is applied on the upper surface of the first end 13 of the first wiring body 10. Next, the second end 23 of the second wiring body 20 is arranged to overlap on the anisotropic conductive adhesive. In doing so, the first end 13 and the second end 23 are so arranged that the first wirings 12 of the first exposed area 13a and the second wirings 22 of the second exposed area 23a are facing each other.

In the adhesion process, by hardening the anisotropic conductive adhesive, the first wirings 12 and the second wirings 22 that are facing each other are bonded to become conductive in an up-down direction. Specifically, the laminated section 31 sandwiching the anisotropic conductive adhesive is heated from the second wiring body 20 side, while being pressurized in an up-down direction. By doing so, the anisotropic conductive adhesive is hardened, and the conductive adhesive layer 30 is formed. As a result, the first exposed area 13a and the second exposed area 23a are bonded. The second covered area 23b and the cover film 40 covering the first covered area 13b are bonded.

Functions and Effects

Next, functions and effects of the wiring body connection structure 1 are explained. According to the wiring body connection structure 1, the front end and the back end of the second wiring body 20 are respectively connected to the first wiring body 10 and a connector provided on an electrical circuit board. By doing so, the flexible extendable and contractible first wiring body 10 can be connected to the electrical circuit board via the existing second wiring body 20 with a low cost and a high reliability.

In the laminated section 31, the first covered area 13b and the second covered area 23b are bonded via the cover film 40. That is, the cover film 40 is interposed between the frontmost end 230 of the second end 23 contained in the second covered area 23b and the first wirings 12 of the first covered area 13b. Therefore, even when a stress is generated in the frontmost end 230 of the second end 23 by extension and contraction of the first wiring body 10, the stress does not act on the first wirings 12, but on the cover film 40. That is, it is unlikely to apply a force in a direction that the frontmost end 230 of the second end 23 peels off to the first wirings 12. The cover film 40 has a tensile strength that is greater than the tensile strength of the first wirings 12. Therefore, even when a stress is applied from the frontmost end 230 of the second end 23, the cover film 40 is unlikely to break. Therefore, according to the wiring body connection structure 1, it is possible to inhibit breakage of the first wirings 12 during use. That is, the wiring body connection structure 1 has an excellent durability.

In the fabrication process of the wiring body connection structure 1, when the laminated section 31 has been pressurized, a corner portion of the frontmost end 230 of the second end 23 abuts the cover film 40 via the conductive adhesive. The cover film 40 acts as a buffer, thereby reducing stress on the first wirings 12. Therefore, the first wirings 12 are unlikely to break during pressurizing.

In the wiring body connection structure 1, the upper surface of the first wiring body 10 is covered by the cover film 40. Therefore, the first wirings 12 can be insulated from outside, which leads to high safety. Waterproofing of the first wirings 12 can be ensured, and also oxidation can be inhibited. Further, according to the wiring body connection structure 1, the cover film 40 extends to a portion (the first covered area 13b) of the laminated section 31. By doing so, the above described wire breakage inhibition effect for the first wirings 12 can be achieved. That is, in order to protect the first wirings 12, it is not necessary to separately prepare a cover member arranged in the laminated section 31. Therefore, according to the wiring body connection structure 1, fewer parts are required, and fabrication is also easy.

According to the wiring body connection structure 1, the first wiring body 10 and the second wiring body 20 are bonded via the conductive adhesive layer 30. Therefore, as compared to a mechanical bonding by biting, a contact failure is unlikely to occur. Further, the conductive adhesive layer 30 is both conductive and adhesive. Therefore, as compared to a case where other materials are used for the connection, the wiring body connection structure 1 is easily downsized and thinned.

Further, the conductive adhesive layer 30 is made of an anisotropic conductive adhesive. This allows the first wirings 12 and the second wirings 22 that are facing each other to be bonded and become conductive in the up-down direction. On the other hand, the conductive adhesive layer 30 has low conductivity in a left-right direction. Therefore, in the first end 13, there is no risk that neighboring first wirings 12 may be conductive in the left-right direction. Similarly, in the second end 23, there is no risk that neighboring second wirings 22 may be conductive in the left-right direction. In this way, according to the conductive adhesive layer 30, a plurality of wirings 12 and 22 that are facing each other can be collectively bonded and made conductive.

As an anisotropic conductive adhesive, a heat hardening type adhesive having an epoxy resin as a base compound is used. Hardening of the anisotropic conductive adhesive is performed at a low temperature of about 150° C. and is completed in a short time of about 10-15 seconds. Therefore, the silicone rubber and the acrylic rubber that make up the first wiring body 10 are difficult to thermally expand. Therefore, it is less likely for width and location of the preformed first wirings 12 to change by heating during hardening. Further, in the adhesion process of the fabrication of the wiring body connection structure 1, heating is performed from the second wiring body 20 side for which thermal expansion is difficult. This allows inhibition of thermal expansion of the elastomer that makes up the first wiring body 10. As a result, displacement and the like of the first wirings 12 can be inhibited, and the first wirings 12 and the second wirings 22 that are facing each other can be surely made conductive.

Other

In the above, an embodiment of the wiring body connection structure of the present invention was explained. However, the embodiment is not limited in particular to the described configuration. It is also possible to embody the present invention with various modifications and improvements that can be devised by those skilled in the art.

For example, in the above described embodiment, the cover film for insulating the first wirings in the first wiring body was used as a cover member. However, the cover film is not always necessary. In this case, a cover member may be separately arranged between the forefront of the second end and the first wirings. It is also possible to arrange a cover film as a separate member from the cover member.

It is desirable that the cover member has a greater mechanical strength as compared to the first wirings. For example, it is preferred that the cover member has a tensile strength of 1 MPa or more and 10 MPa or less. As in the above described embodiment, when using the cover film for insulating the first wirings as a cover member, considering flexibility and the like that are necessary for a cover film, it is desirable that the cover member (cover film) has a Young's modulus of 0.1 MPa or more and 10 MPa or less.

From a point of view of enhancing the wire breakage inhibition effect of the first wirings, it is desirable that the cover member has a large thickness. For example, it is desirable that the cover member has a thickness the same as or greater than the first wirings. However, as in the above described embodiment, when the cover film for insulating the first wirings is used as the cover member, it is necessary to ensure the flexibility of the cover film. Therefore, it is desirable that the cover member (cover film) has a thickness the same or smaller than the first base material.

The number of wirings of the first wiring body and the second wiring body is not particularly limited. For example, one wiring may be arranged in each of the wiring bodies. When a plurality of wirings are arranged, it is necessary to prevent conduction between neighboring wirings. Therefore, in the case of a plurality of wirings, it is desirable that the cover member is made of an insulating material.

As a material for the cover member, besides the silicone rubber in the above described embodiment, other suitable materials include, for example, an ethylene-propylene copolymer rubber, a natural rubber, a styrene-butadiene copolymer rubber, an acrylonitrile-butadiene copolymer rubber, an acrylic rubber, an epichlorohydrine rubber, a chlorosulfonated polyethylene, a chlorinated polyethylene, an urethane rubber, a fluororubber, a chloroprene rubber, an isobutylene isoprene rubber, various thermoplastic elastomer and the like. These materials are also suitable materials for the cover film.

In the above described embodiment, as the second wiring body, an FFC was used. However, the second wiring body is not limited to an FFC. As the second wiring body, for example, it is also possible to use a flexible printed circuit board (FPC) and the like. According to an FPC, a desired wiring pattern can be easily formed by etching. Therefore, spacing between neighboring second wirings can be easily altered, and the second wirings can be easily connected to each other and consolidated. The type of the connector to which the second wiring body connects is not particularly limited. For example, an existing connector (such as a ZIF connector) connectable to an FPC, an FFC, and the like, can be used.

As a material for the elastomer that makes up the first base material of the first wiring body, besides the silicone rubber in the above described embodiment, other materials that can be used include an ethylene-propylene copolymer rubber, a natural rubber, a styrene-butadiene copolymer rubber, an acrylonitrile-butadiene copolymer rubber, an acrylic rubber, an epichlorohydrine rubber, a chlorosulfonated polyethylene, a chlorinated polyethylene, an urethane rubber, a fluororubber, a chloroprene rubber, an isobutylene isoprene rubber, various thermoplastic elastomer and the like.

The first wirings of the first wiring body contain an elastomer and a conductive material. The elastomer may be the same as or different from the elastomer of the first base material. Besides the acrylic rubber in the above described embodiment, other suitable materials include, for example, a silicone rubber, an ethylene-propylene copolymer rubber, a natural rubber, a styrene-butadiene copolymer rubber, an acrylonitrile-butadiene copolymer rubber, an urethane rubber, an epichlorohydrine rubber, a chlorosulfonated polyethylene, a chlorinated polyethylene and the like. The type of the conductive material is not particularly limited. For example, metal powder of silver, gold, copper, nickel and the like, conductive carbon powder and the like are suitable. To develop a desired electrical conductivity, it is desirable that a filling rate of the conductive material in the elastomer is 20% or more by volume when the volume of the wirings is 100% by volume. On the other hand, when the filling rate exceeds 65% by volume, mixing with the elastomer becomes difficult, and molding processability becomes poor. In addition, extendibility and contractibility of the wirings become poor. Therefore, it is desirable that the filling rate of the conductive material is 50% or less by volume.

The method of formation of the wirings is not particularly limited. For example, first, from a paint for wiring containing a wiring formation component, unvulcanized film-like wirings are fabricated. Next, the wirings are arranged on a front surface of the first base material, and are pressed and vulcanization-bonded under predetermined conditions. The paint for wiring may also be printed on the front surface of the first base material, and then dried by heating to volatilize solvent in the paint. According to the printing method, a cross-linking reaction of the elastomer component can proceed while drying during heating. Examples of the printing method include, for example, screen printing, inkjet printing, flexo printing, gravure printing, pad printing, lithography, and the like. Among these, for the reasons that a high-viscosity paint can be used and adjustment of the thickness of the paint film is easy, the screen printing method is preferred. The paint for wiring may be prepared by mixing wiring formation components (elastomer, conductive material, additive agents, and the like) with a solvent. In this case, to achieve a desired viscosity, a solid content concentration can be adjusted.

In the above described embodiment, as the conductive adhesive layer, an anisotropic conductive adhesive was used having an epoxy resin (thermoset adhesive) as a parent material. As a base compound of a thermoset adhesive, besides the above described epoxy resin, a phenol resin, an acrylic resin, a polyurethane and the like can be used. According to the type of the base compound, additive agents such as a hardening agent and the like can be combined as appropriate. When the number of wirings in each of the first wiring body and the second wiring body is one, the conductive adhesive layer may have no anisotropy.

Regardless of whether anisotropy exists, as the parent material of the conductive adhesive that makes up the conductive adhesive layer, besides the thermoset adhesive, a thermoplastic adhesive, an ultraviolet cure adhesive, an elastomeric adhesive and the like can be used.

For example, according to the thermoset adhesive, there is an advantage that a strong adhesion force can be achieved in a broad temperature range. Further, a glass transition temperature (Tg) of 100° C. or more can be easily realized. Therefore, as compared to a thermoplastic adhesive, there is an advantage that an operational temperature range is broad. Generally, a thermoset adhesive has a higher glass transition temperature than a thermoplastic adhesive. When a glass transition occurs in an operational temperature range, it is in a glass state when the temperature is below the glass transition temperature, and has a high elastic modulus. On the other hand, when the temperature is above the glass transition temperature, it is in a rubber state. Therefore, an abrupt decrease in the elastic modulus and an abrupt increase in a coefficient of thermal expansion occur. As just described, depending on whether the temperature is above or below the glass transition temperature, physical properties of the conductive adhesive change significantly, which may induce a change in adhesion strength accompanying a change in the elastic modulus, a change in size due to a change in the coefficient of thermal expansion, and a change in conductivity and the like. Therefore, according to the thermoset adhesive having a high glass transition temperature, a broad temperature range can be set where reliability is ensured.

From the point of view of inhibiting thermal expansion of the elastomer of the first wiring body, it is desirable that the thermoset adhesive is hardened at a low temperature and in a short time. Specifically, it is desirable that the hardening temperature is 130° C. or more and 180° C. or less. It is desirable that the hardening time is 60 seconds or less, or even 20 seconds or less. When the thermoset adhesive is used as a parent material, from the point of view of inhibiting thermal expansion of the elastomer, it is preferred that the hardening of the conductive adhesive is performed in a state in which a heat releaser is arranged on the first wiring body side. Examples of a heat releaser include a radiator plate, a heat exchange device using a refrigerant, and the like. From the point of view of inhibiting changes in physical properties of the conductive adhesive and ensuring reliability of the connection section, it is desirable that the glass transition temperature (Tg) is as high as possible. For example, it is favorable that Tg is 130° C. or more. Examples of a favorable anisotropic conductive adhesive using a thermoset adhesive as a parent material include anisotropic conductive connection materials "TAP0402F" and "TAP0401C" manufactured by Kyocera Chemical Corporation and the like.

As a base compound of the ultraviolet cure adhesive, similar to the above described thermoset adhesive, an epoxy resin, an acrylic resin and the like can be used. According to the type of the base compound, additive agents such as a hardening agent and the like can be combined as appropriate.

Examples of a thermoplastic resin that is used for a thermoplastic adhesive include, for example, a polyester resin, a polyurethane and the like. Examples of a favored anisotropic conductive adhesive that is used for a parent material of a thermoplastic adhesive include an anisotropic conductive adhesive "NIR-30E" manufactured by Sanyu Rec Co., Ltd., and the like.

Examples of an elastomer that is used for an elastomeric adhesive include, for example, a chloroprene rubber, an acrylic rubber and the like. Examples of a favored anisotropic conductive adhesive that is used for a parent material of an elastomeric adhesive include anisotropic conductive adhesive "NIR-11" manufactured by Sanyu Rec Co., Ltd., "TB3373C" manufactured by ThreeBond Co., Ltd., and the like.

The type of conductive particles filling a parent material is not particularly limited. Metal particles of nickel and the like, resin particles having surfaces coated with a metal, and the like, can be used. According to the type of the parent material being used, the method and conditions for solidification or hardening of the conductive adhesive can be decided as appropriate. It is desirable that the solidification or hardening of the conductive adhesive is performed while the laminated section is pressurized. For example, it is preferred that the pressure is about 9.8-490 kPa.

Industrial Applicability

The wiring body connection structure of the present invention is useful for connecting an extendable and contractible wiring body (which is as in a flexible sensor, actuator, and the like, that utilizes an elastomer) to an electrical circuit.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A wiring body connection structure comprising:
    a first wiring body; and
    a second wiring body,
    the first wiring body comprising:
        a first base material made of an elastomer; and
        a first wiring arranged on the first base material, and the first wiring containing an elastomer and a conductive material so that the first wiring is stretchable,
    the second wiring body comprising:
        a second base material including an insulating material; and
        a second wiring arranged on the second base material, the insulating material of the second base material being provided on a surface of the second wiring, and the second wiring body being one of a flexible flat cable and a flexible printed circuit board so that the second wiring is flexible,
    wherein a laminated section is partitioned in which a first end of the first wiring body and a second end of the second wiring body overlap in a front-rear direction, and
    the wiring body connection structure further comprises:
        a cover member arranged on a front surface of the first wiring body, the cover member comprising an elastomer so that the cover member is stretchable; and
        a conductive adhesive layer bonding the first end and the second end in the laminated section while ensuring a conductive property,
    the cover member being interposed between a foremost end of the second end and the first wiring in the laminated section,
    wherein the conductive adhesive layer has a continuous recess formed at a front end of the conductive adhesive layer in a lower surface thereof, and wherein a front end of the cover member is positioned within the recess, wherein
        on a front surface of the first end, a first exposed area and a first covered area are arranged, the first exposed area being not covered by the cover member, the first covered area being contiguous to the first exposed area and being covered from above by the cover member,
        the first exposed area being defined by a front end of the first wiring body, wherein the first covered area and the first exposed area lie entirely within a same plane, and
        a lower surface of the cover member and an upper surface of the first covered area being in direct contact with each other throughout an entire region in which the front end of the cover member is positioned within the recess,
    wherein the cover member has a tensile strength greater than a tensile strength of the first wiring, and
    the second wiring of the second wiring body is arranged up to a foremost end of the second end and, through the entire first covered area of the first wiring body, the first wiring of the first wiring body and the second wiring of the second wiring body are in direct contact with the cover member and the conductive adhesive layer interposed therebetween.

2. The wiring body connection structure according to claim 1, wherein
    on a lower surface of the second end, a second exposed area and a second covered area are arranged, the second exposed area being not covered by the cover member, the second covered area being contiguous to the second exposed area, being covered from below by the cover member and containing the frontmost end, and
    the first exposed area and the second exposed area are bonded via the conductive adhesive layer, the first covered area and the second covered area are bonded via the conductive adhesive layer and the cover member.

3. The wiring body connection structure according to claim 1, wherein the cover member is a cover film insulating the first wiring from outside.

4. The wiring body connection structure according to claim 2, wherein the cover member is a cover film insulating the first wiring from outside.

5. The wiring body connection structure according to claim 1, wherein
    the first wiring body comprises a plurality of the first wirings,
    the second wiring body comprises a plurality of the second wirings, and
    the conductive adhesive layer is made from an anisotropic conductive adhesive allowing the first wirings and the second wirings that are facing each other in the front-rear direction to become conductive.

6. The wiring body connection structure according to claim 2, wherein
    the first wiring body comprises a plurality of the first wirings,
    the second wiring body comprises a plurality of the second wirings, and
    the conductive adhesive layer is made from an anisotropic conductive adhesive allowing the first wirings and the second wirings that are facing each other in the front-rear direction to become conductive.

7. The wiring body connection structure according to claim 5, wherein
    the first wiring body comprises a plurality of the first wirings,
    the second wiring body comprises a plurality of the second wirings, and
    the conductive adhesive layer is made from an anisotropic conductive adhesive allowing the first wirings and the second wirings that are facing each other in the front-rear direction to become conductive.

8. The wiring body connection structure according to claim 4, wherein
the first wiring body comprises a plurality of the first wirings,
the second wiring body comprises a plurality of the second wirings, and
the conductive adhesive layer is made from an anisotropic conductive adhesive allowing the first wirings and the second wirings that are facing each other in the front-rear direction to become conductive.

9. The wiring body connection structure according to claim 1, wherein the cover member has a tensile strength of 2.5 MPa, and the first wiring has a tensile strength of 0.3 MPa.

* * * * *